United States Patent
Durec

[19]

[11] Patent Number: 6,144,846
[45] Date of Patent: Nov. 7, 2000

[54] FREQUENCY TRANSLATION CIRCUIT AND METHOD OF TRANSLATING

[75] Inventor: Jeffrey C. Durec, Chandler, Ariz.

[73] Assignee: Motorola, Inc., Schaumburg, Ill.

[21] Appl. No.: 09/002,307

[22] Filed: Dec. 31, 1997

[51] Int. Cl.$^7$ ....................................... H04Q 7/32
[52] U.S. Cl. ........................ 455/323; 455/326; 455/313; 455/314; 455/112; 455/113; 455/118; 327/113; 327/116; 327/119
[58] Field of Search ...................... 455/323, 326, 455/313, 333, 112, 113, 118, 110, 255, 256, 260, 314, 315; 327/356, 355, 113, 116, 119

[56] References Cited

U.S. PATENT DOCUMENTS

| | | | |
|---|---|---|---|
| 3,753,142 | 8/1973 | Nardin et al. | 331/1 |
| 5,220,688 | 6/1993 | Tao | 455/323 |
| 5,303,417 | 4/1994 | Laws | 455/323 |
| 5,410,743 | 4/1995 | Seely et al. | 455/326 |
| 5,668,505 | 9/1997 | Vu et al. | 331/49 |
| 5,790,942 | 8/1998 | Le Corre et al. | 455/112 |

OTHER PUBLICATIONS

"Introduction to Communication Systems", Third Edition, by Ferrel G. Stremler, Copyright 1990, Example 5.3.1, pp. 254–255.

*Primary Examiner*—Lee Nguyen
*Assistant Examiner*—Keith Ferguson
*Attorney, Agent, or Firm*—Lanny L. Parker

[57] ABSTRACT

A frequency translation circuit (10) translates an incoming reference signal ($RF_{IN}$) to a lower frequency using a compound mixer circuit (42). The compound mixer circuit (42) has a first mixer circuit (14A) that receives both the incoming reference signal ($RF_{IN}$) and a signal generated by a first counter (28A). A second mixer circuit (14X) of the compound mixer circuit (42) receives a signal generated by a second counter (28X) and further translates the signal received from the first mixer circuit (14A) to a lower frequency. Both the first mixer circuit (14A) and the second mixer circuit (14X) generate output signals having a carrier frequency that is lower in frequency by the difference of the two input signals.

4 Claims, 3 Drawing Sheets

FREQUENCY TRANSLATION CIRCUIT AND METHOD OF TRANSLATING

BACKGROUND OF THE INVENTION

The present invention relates, in general, to integrated circuits and, more particularly, to integrated mixer circuits for providing frequency translation.

In electronic systems such as cellular or wireless telephones, a frequency relationship exists between an incoming signal and a signal generated by a Local Oscillator (LO). The incoming signal can be a modulated signal containing information that is recovered in a receiver of the electronic system. The modulated signal and the signal generated by the LO can be mixed to translate the carrier frequency of the modulated signal from the Radio Frequency (RF) range to a signal having a frequency in an Intermediate Frequency (IF) range.

Typically, the signal generated by the LO has a large amplitude compared to the amplitude of the received incoming signal. A high amplitude incoming signal can affect the frequency of the LO signal and "pull" the frequency of the LO signal away from a desired nominal frequency and toward the frequency of the incoming signal. Generally, the frequency of the signal generated by the LO is substantially independent of the frequency of the incoming signal. Alternatively, the amplitude of the incoming signal can affect the impedance of a tank circuit that defines the frequency of the LO signal. The change in impedance of the tank circuit "pushes" the frequency of the LO signal away from the frequency of the incoming signal. To prevent either "pulling" or "pushing" of the LO signal frequency away from the desired nominal frequency, the amplitude of the received incoming signal should be low and the frequencies of the incoming signal and the LO signal should be far apart.

Accordingly, it would be advantageous to have a method and a receiver circuit for translating the frequency of the incoming signal. It would be of further advantage to have the receiver circuit operate with an LO signal that has a frequency substantially different from the frequency of the incoming signal.

DETAILED DESCRIPTION OF THE DRAWINGS

Generally, the present invention provides frequency translation of an incoming reference signal using a local oscillator, a divide-by-N counter, and a plurality of mixer circuits. The configuration of the frequency translation circuit allows multiple mixer circuits to be arranged such that the number of components is reduced.

Figure 1:
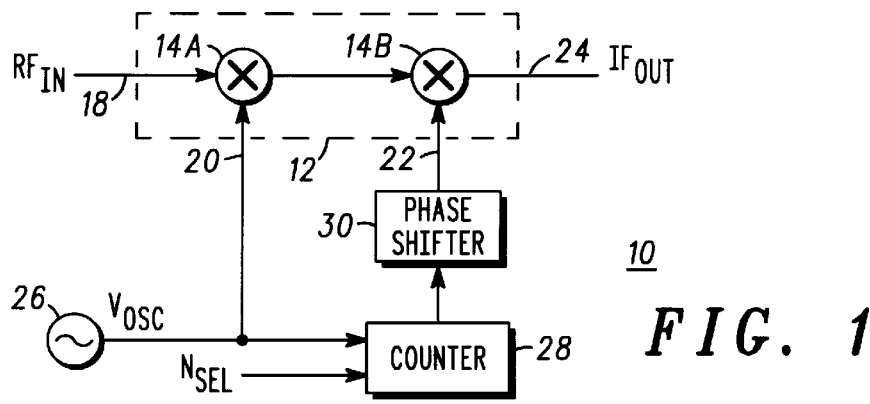
FIG. 1 is a block diagram of a frequency translation circuit in accordance with a first embodiment of the present invention.

FIG. 1 is a block diagram of a frequency translation circuit 10 in accordance with the present invention. Frequency translation circuit 10 is also referred to as a frequency translator circuit or a frequency converter. Frequency translation circuit 10 has an input for receiving a reference signal $RF_{IN}$ and an output for supplying a signal $IF_{OUT}$. Included in frequency translation circuit 10 is a compound mixer 12 having mixer circuits 14A and 14B. Frequency translation circuit 10 further includes a counter 28 and a phase shifter 30.

Compound mixer 12 has input terminals 18, 20 and 22, and an output terminal 24. Mixer circuit 14A has one input terminal connected to terminal 18 and another input connected to terminal 20. An output of mixer circuit 14A is connected to a first input of mixer circuit 14B. A second input of mixer circuit 14B is connected to terminal 22. An output of mixer circuit 14B is connected to terminal 24 of compound mixer 12. A reference signal $RF_{IN}$ is received at input terminal 18 and an output signal $IF_{OUT}$ is generated at terminal 24 of compound mixer 12.

Translation circuit 10 further includes a local oscillator 26 that generates the signal $V_{OSC}$. Local oscillator 26 has an output that is commonly connected to terminal 20 of compound mixer 12 and to a first input of a counter 28. A second input of counter 28 is coupled for receiving a select signal $N_{SEL}$. An output of counter 28 is connected to an input of a phase shifter 30. An output of phase shifter 30 is connected to terminal 22 of compound mixer 12.

In operation, mixer circuit 14A provides an output signal $IF_{OUT}$ whose carrier frequency is shifted relative to that of the input signal $RF_{IN}$ by an amount equal to the frequency $V_{OSC}$ of local oscillator 26. More particularly, mixer circuit 14A multiplies the signal $RF_{IN}$ by the signal $V_{OSC}$ to provide an output signal that is translated to a higher or lower frequency. Counter 28 is a divide-by-N counter that reduces the frequency of the signal $V_{OSC}$ in accordance with select signal $N_{SEL}$. Thus, counter 28 divides the signal $V_{OSC}$ by an integer "N" to produce a counter output signal. When the integer "N" is 2, 4, 8, etc., counter 28 produces a counter output signal that is respectively one-half, one-fourth, one-eighth, etc., the frequency of the signal $V_{OSC}$. Although the relationship between the frequency of the signal $V_{OSC}$ and the frequency of the signal at the output terminal of counter 28 has been shown to be a binary relationship, it should be understood this is not a limitation of the present invention.

The output signal of counter 28 is then phase shifted by phase shifter 30 and transmitted to terminal 22 of compound mixer 12. Typically, counter 28 generates an output signal that is either in phase with the signal $V_{OSC}$ or that lags the signal $V_{OSC}$ by 90°. Thus, phase shifter 30 phase shifts the output signal from counter 28 by either 0° or 90°, relative to signal $V_{OSC}$, and transmits the phase shifted signal to terminal 22 of compound mixer 12. In general, phase shifter 30 generates an output signal that can vary over a range of frequency values, wherein the output signal has a desired phase relationship with respect to the signal $V_{OSC}$.

Mixer circuit 14B provides an output signal $IF_{OUT}$ whose carrier frequency differs from that of the input signal received from mixer circuit 14A by an amount equal to the frequency generated by counter 28. In other words, mixer circuit 14B provides an output signal $IF_{OUT}$ that is translated to a lower frequency in accordance with the signal generated by counter 28. Thus, compound mixer 12 translates the signal $RF_{IN}$ whose carrier frequency is in the Radio Frequency (RF) range to the signal $IF_{OUT}$ whose carrier frequency is shifted to the Intermediate Frequency (IF) range.

TABLE 1 lists examples of select signal ($N_{SEL}$) values for counter 28 and operating frequencies for signals at terminals 18, 20, 22, and 24 of compound mixer 12. In particular, the first two rows of TABLE 1 illustrate examples in which an intermediate frequency of 100 MHz is desired and the last two rows of TABLE 1 illustrate examples in which an intermediate frequency of 300 MHz is desired.

TABLE 1

| VALUE OF $N_{SEL}$ | SIGNAL AT TERMINAL 18 | SIGNAL AT TERMINAL 20 | SIGNAL AT TERMINAL 22 | SIGNAL AT TERMINAL 24 |
|---|---|---|---|---|
| INFINITE | 900 MHz | 1 GHz | CONSTANT | 100 MHz |
| 1 | 1900 MHz | 1 GHz | 1 GHz | 100 MHz |
| 4 | 900 MHz | 800 MHz | 200 MHz | 300 MHz |
| 1 | 1900 MHz | 800 MHz | 800 MHz | 300 MHz |

For example, when signal $RF_{IN}$ appearing at input terminal 18 of compound mixer 12 has a frequency of 900 MegaHertz (MHz) and signal $V_{OSC}$ appearing at terminal 20 has a frequency of 1 GigaHertz (GHz), mixer circuit 14A generates an output signal having a frequency that is the difference between 1 GHz and 900 MHz, i.e., a frequency of 100 MHz. The value of select signal $N_{SEL}$ for divide-by-N counter 28 is chosen to be very large, e.g., approaching infinite. Thus, the output signal of counter 28 has a steady state or constant value. The constant value provided at input terminal 22 of compound mixer 12 causes the output signal of mixer circuit 14A to be transferred to terminal 24 of compound mixer 12. In other words, mixer circuit 14B does not translate the 100 MHz signal received from mixer circuit 14A, but rather transfers the 100 MHz signal to terminal 24, where it becomes output signal $IF_{OUT}$.

Now referring to row 2 of TABLE 1 for a second example, signal $RF_{IN}$ appearing at input terminal 18 of compound mixer 12 has a frequency of 1900 MHz, signal $V_{OSC}$ appearing at terminal 20 has a frequency of 1 GHz, and the value of select signal $N_{SEL}$ is 1. Under these operating parameters, mixer circuit 14A generates an output signal having a frequency that is the difference between 1900 Mhz and 1 GHz, i.e., a frequency of 900 MHz. Because the value of select signal $N_{SEL}$ is 1, counter 28 generates an output signal having the same frequency as the input signal. In other words, mixer circuit 14B receives an input signal having a frequency of 900 MHz from mixer circuit 14A and a signal having a frequency of 1 GHz at terminal 22. Mixer circuit 14B generates an output signal $IF_{OUT}$ having a frequency that is the difference between 1 GHz and 900 MHz, i.e., a frequency of 100 MHz.

Now referring to row 3 of TABLE 1 for a third example, signal $RF_{IN}$ appearing at input terminal 18 of compound mixer 12 has a frequency of 900 MHz, signal $V_{OSC}$ appearing at terminal 20 has a frequency of 800 MHz, and select signal $N_{SEL}$ has a value of 4. Under these operating parameters, mixer circuit 14A generates an output signal having a frequency that is the difference between 900 MHz and 800 MHz, i.e., a frequency of 100 MHz. Because the value of select signal $N_{SEL}$ is 4, counter 28 generates an output signal having a frequency of 200 MHz. Thus, mixer circuit 14B receives an input signal having a frequency of 100 MHz from mixer circuit 14A and a signal having a frequency of 200 MHz at terminal 22. Mixer circuit 14B generates an output signal $IF_{OUT}$ having a frequency that is the sum of the frequencies 100 MHz and 200 MHz, i.e., a frequency of 300 MHz.

Now referring to row 4 of TABLE 1 for a fourth example, signal $RF_{IN}$ appearing at terminal 18 of compound mixer 12 has a frequency of 1900 MHz, signal $V_{OSC}$ appearing at terminal 20 has a frequency of 800 MHz, and select signal $N_{SEL}$ has a value of 1. Under these operating parameters, mixer circuit 14A generates an output signal having a frequency that is the difference between 1900 MHz and 800 MHz, i.e., a frequency of 1100 MHz. Because the value of select signal $N_{SEL}$ is 1, counter 28 generates an output signal having a frequency of 800 MHz. Thus, mixer circuit 14B receives an input signal having a frequency of 1100 MHz from mixer circuit 14A and a signal having a frequency of 800 MHz at terminal 22. Mixer circuit 14B generates an output signal $IF_{OUT}$ having a frequency that is the difference between 1100 MHz and 800 MHz, i.e., a frequency of 300 Mhz.

As those skilled in the art are aware, mixer circuits such as mixer circuits 14A and 14B generate both sum and difference signals. The choice of which signal to select is a design choice and is accomplished by coupling a filter circuit (not shown) to the mixer circuit. Thus, the filter circuit used to obtain the results of row 3 of TABLE 1 selects the summed signal and the filter circuit used to obtain the results of rows 1, 2, and 4 of TABLE 1 selects the difference signals.

Thus, comparing the first and second rows of TABLE 1 shows that for an input frequency of either 900 MHz or 1900 MHz, the signal $IF_{OUT}$ has a frequency of 100 MHz when the value of select signal $N_{SEL}$ approaches infinity or is one, respectively. Comparing the third and fourth rows of TABLE 1 shows that for an input frequency of either 900 MHz or 1900 MHz, the signal $IF_{OUT}$ has a frequency of 300 MHz when the value of select signal $N_{SEL}$ of counter 28 is four or one, respectively. Selecting select signal $N_{SEL}$ to have a value between 1 and infinity allows dual-band operation in translating either of the selected signals in the RF frequency range to a signal in the IF frequency range. Thus, frequency translation circuit 10 provides an integratable solution for providing dual-band frequency translation.

Figure 2:
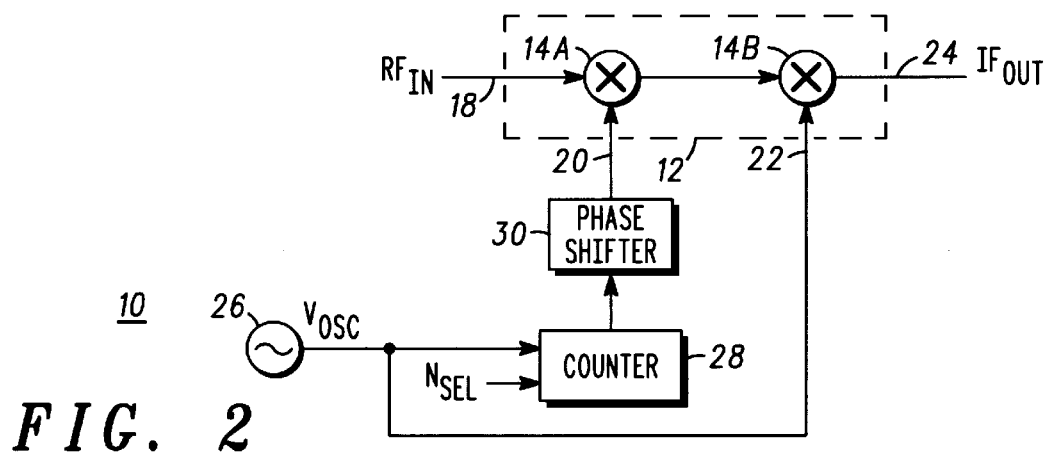
FIG. 2 is a block diagram of a frequency translation circuit in accordance with a second embodiment of the present invention.

FIG. 2 is a block diagram of frequency translation circuit 10 in accordance with a second embodiment of the present invention. It should be noted that the same reference numbers are used in the figures to denote the same elements. In the second embodiment, the output of counter 28 is coupled to terminal 20 of compound mixer 12 via phase shifter 30. Further, the output of local oscillator 26 is commonly connected to terminal 22 of compound mixer 12 and to a first input of counter 28. A second input of counter 28 is coupled for receiving select signal $N_{SEL}$. An output of counter 28 is connected to the input of phase shifter 30. The output of phase shifter 30 is connected to terminal 20 of compound mixer 12. Terminals 18 and 24 of compound mixer 12 are coupled for receiving the reference signal $RF_{IN}$ and supplying the signal $IF_{OUT}$, respectively.

In operation, mixer circuit 14A provides an output signal whose carrier frequency differs from that of the input signal $RF_{IN}$ by the frequency of the signal generated by counter 28. In other words, mixer circuit 14A receives the input signal $RF_{IN}$ and provides an output signal that is translated to a lower frequency in accordance with the frequency of the signal generated by counter 28. The signal at the output of counter 28 has a frequency that is selected in accordance with select signal $N_{SEL}$. Mixer circuit 14B provides an output signal $IF_{OUT}$ whose carrier frequency differs from that of the input signal received from mixer circuit 14A by an amount equal to the frequency of the signal $V_{OSC}$. In other words, mixer circuit 14B provides an output signal $IF_{OUT}$ that is translated to a lower frequency in accordance with the signal $V_{OSC}$. The second embodiment of frequency translation circuit 10 is similar to the first embodiment in that the values of select signal $N_{SEL}$ between one and infinity allow dual-band frequency translation from the RF frequency range to a lower frequency range.

Figure 3:
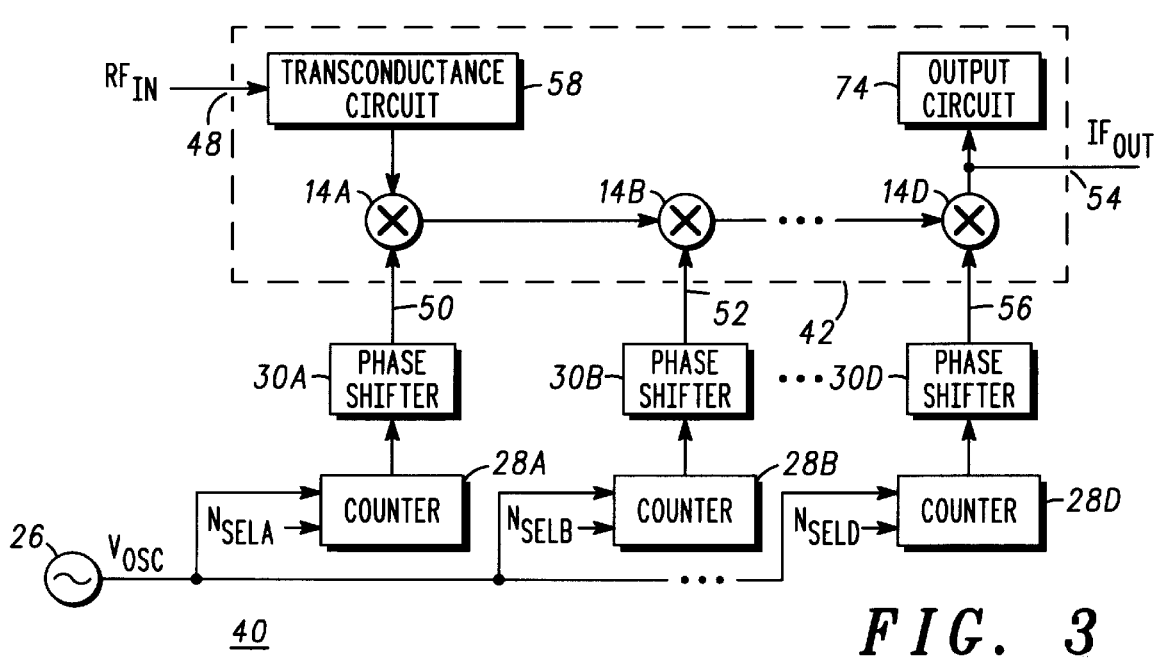
FIG. 3 is a block diagram of a frequency translation circuit that includes a compound mixer in accordance with the present invention.

FIG. 3 is a block diagram of a generalized frequency translation circuit 40 in accordance with the present invention. Frequency translation circuit 40 includes a compound mixer circuit 42 that is comprised of a plurality of mixer circuits 14A, 14B, . . . , and 14X, a transconductance circuit 58, and an output circuit 74. The letters A, B, . . . , and X appended to the number 14 indicate that a plurality of mixer circuits can be included in frequency translation circuit 40. It should be noted that the number of mixer circuits included in compound mixer circuit 42 is not a limitation of the present invention and that the letter "X" indicates that any number of mixer circuits can be included in compound mixer circuit 42. Compound mixer circuit 42 has terminals 48, 50, 52, and 56 that serve as input terminals of compound mixer circuit 42 and a terminal 54 that serves as an output terminal. Mixer circuit 42 receives a reference signal $RF_{IN}$ at terminal 48 and transmits an output signal $IF_{OUT}$ at terminal 54.

More particularly, transconductance circuit 58 has an input coupled for receiving the signal $RF_{IN}$. Mixer circuit 14A has a first input connected to terminal 50 and a second input connected to an output of transconductance circuit 58. An output of mixer circuit 14A is connected to a first input of mixer circuit 14B. A second input of mixer circuit 14B is connected to terminal 52 of compound mixer circuit 42. Mixer circuit 14X has a first input coupled to an output of the preceding mixer circuit and a second input connected to terminal 56 of compound mixer circuit 42. An output of mixer circuit 14X is connected to an input of output circuit 74. An output of output circuit 74 is connected to terminal 54 of compound mixer circuit 42. It should be noted that the ellipses in FIG. 3 indicate that there may be one or more mixer circuits, phase shifters, and counters.

In addition, frequency translation circuit 40 includes a local oscillator 26 that generates the signal $V_{OSC}$. Local oscillator 26 has an output that is commonly connected to a first input of counters 28A, 28B, . . . , and 28X. Second inputs of counters 28A, 28B, . . . , and 28X are coupled for receiving a select signal $N_{SELA}$, $N_{SELB}$, . . . , $N_{SELX}$, respectively. The outputs of counters 28A, 28B, . . . , and 28X are connected to corresponding inputs of phase shifters 30A, 30B, . . . , and 30X. The outputs of phase shifters 30A, 30B, . . . , and 30X are connected to the respective terminals 50, 52, . . . , 56 of compound mixer circuit 42. When frequency translation circuit 40 has, for example, two mixer circuits, compound mixer circuit 42 has input terminals 48, 50, 56, and an output terminal 54. For this example, compound mixer circuit 42 includes transconductance circuit 58, mixer circuits 14A and 14X, and output circuit 74. The output of mixer circuit 14A is connected to the first input of mixer circuit 14X. Additionally, counters 28A and 28X provide signals through respective phase shifter circuits 30A and 30X to terminals 50 and 56. The letter "X" indicates that any number of mixer circuits, phase shifters, and counters can be included in compound mixer circuit 42.

It should be noted that frequency translation circuit 40 of FIG. 3 includes signals from divide-by-N counters 28A, 28B, . . . , and 28X, as inputs to each of the corresponding mixer circuits 14A, 14B, . . . , and 14X of compound mixer circuit 42. Thus, terminals 50, 52, . . . , 56 of compound mixer circuit 42 may receive a signal having a frequency less than the frequency of the signal $V_{OSC}$. Further, mixer circuits 14A, 14B, . . . , 14X, local oscillator 26, and phase shifters 30A, 30B, . . . , 30X have been illustrated as having single-ended inputs and outputs for simplicity. However, the signals $RF_{IN}$, $V_{OSC}$, and $IF_{OUT}$, among others, may be differential signals. Thus, the present invention is not limited to operating with single-ended signals.

Figure 4:
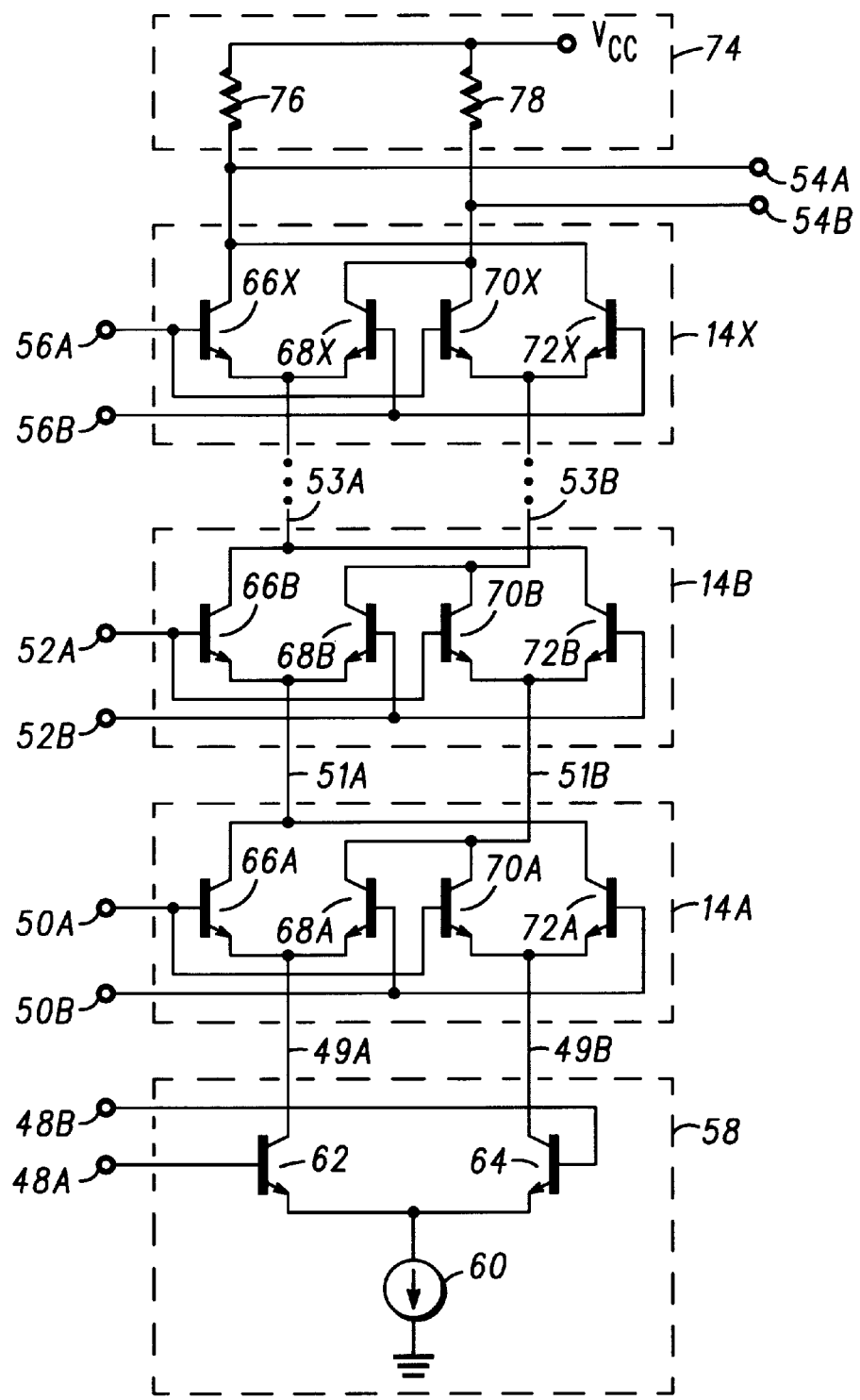
FIG. 4 is a schematic diagram of the compound mixer of FIG. 3.

FIG. 4 is a schematic diagram of compound mixer circuit 42 of FIG. 3 in a differential configuration. Compound mixer circuit 42 includes mixer circuits 14A, 14B, . . . , and 14X in a stacked configuration. Each mixer circuit 14A, 14B, . . . , and 14X includes two differential pairs of NPN bipolar transistors. More particularly, mixer circuit 14A has terminals 51A and 51B that are current output terminals for supplying a current and terminals 49A and 49B that are current input terminals for receiving a current. The letters A and B have been appended to reference numbers 49 and 51 to indicate differential signals. Mixer circuit 14A includes transistors 66A and 68A connected as a first differential pair and transistors 70A and 72A connected as a second differential pair.

Transistors 66A and 68A have emitters that are commonly connected to each other and serve as terminal 49A. Transistors 70A and 72A have emitters that are commonly connected to each other and serve as terminal 49B. Transistors 66A and 70A have bases that are commonly connected to each other and serve as terminal 50A of compound mixer circuit 42. Transistors 68A and 72A have bases that are commonly connected to each other and serve as terminal 50B of compound mixer circuit 42. The letters A and B have been appended to reference number 50 to indicate that the signal received at terminal 50 (FIG. 3) is a differential signal applied to terminals 50A and 50B. Further, transistors 66A and 72A have collectors that are commonly connected to each other and serve as terminal 51A. Transistors 68A and 70A have collectors that are commonly connected to each other and serve as terminal 51B.

Mixer circuit 14B includes transistors 66B and 68B connected as a first differential pair, wherein the emitter of transistor 66B is connected to the emitter of transistor 68B. The commonly connected emitters of transistors 66B and 68B are connected to terminal 51A. Transistors 70B and 72B are connected as a second differential pair, wherein the emitter of transistor 70B is connected to the emitter of transistor 72B. The commonly connected emitters of transistors 70B and 72B are connected to terminal 51B.

Transistors 66B and 70B have bases that are commonly connected and serve as terminal 52A of compound mixer circuit 42. Transistors 68B and 72B have bases that are commonly connected and serve as terminal 52B of compound mixer circuit 42. The letters A and B have been appended to reference number 52 to indicate that the signal received at terminal 52 (FIG. 3) is a differential signal applied to terminals 52A and 52B. Further, transistors 66B and 72B have collectors that are commonly connected and serve as terminal 53A. Transistors 68B and 70B have collectors that are commonly connected and serve as terminal 53B. The letters and A and B have been appended to reference number 53 to indicate that these output terminals of mixer circuit 14B receive differential signals.

Mixer circuit 14X includes transistors 66X and 68X connected as a first differential pair, wherein the emitter of transistor 66X is connected to the emitter of transistor 68X. The commonly connected emitters of transistors 66X and 68X are coupled to terminal 53A. Transistors 70X and 72X are connected as a second differential pair, wherein the emitter of transistor 70X is coupled to the emitter of transistor 72X. The commonly connected emitters of transistors 70X and 72X are coupled to terminal 53B. It should be noted that the ellipses in FIG. 4 indicate that there may be any number of mixer circuits.

Transistors 66X and 70X have bases that are commonly connected to each other and serve as terminal 56A of compound mixer circuit 42. Transistors 68X and 72X have bases that are commonly connected to each other and serve as terminal 56B of compound mixer circuit 42. The letters A and B have been appended to reference number 56 to indicate that the signal received at terminal 56 (FIG. 3) is a differential signal applied to terminals 56A and 56B. Further, transistors 66X and 72X have collectors that are commonly connected and serve as terminal 54A. Transistors 68X and 70X have collectors that are commonly connected and serve as terminal 54B. The letters and A and B have been appended to reference number 54 (FIG. 3) to indicate that these output terminals of mixer circuit 14X transmit a differential output signal $IF_{OUT}$.

Further, compound mixer circuit 42 includes a transconductance circuit 58 and an output circuit 74. Transconductance circuit 58 includes a differential pair of NPN bipolar transistors 62 and 64. The emitters of transistors 62 and 64 are commonly connected to form a virtual terminal that is coupled through a current source 60 to a power supply conductor such as, for example, $V_{EE}$ or ground. The common connection of the emitters of transistors 62 and 64 is referred to as a virtual terminal because a virtual ground is formed during Alternating Current (AC) operation. The bases of transistors 62 and 64 are connected to respective terminals 48A and 48B of compound mixer circuit 42. The letters A and B have been appended to reference number 48 to indicate that the signal $RF_{IN}$ received at terminal 48 (FIG. 3) is a differential signal applied to terminals 48A and 48B.

Output circuit 74 of compound mixer circuit 42 includes pull-up resistors 76 and 78. Terminal 54A is coupled to a power supply conductor via resistor 76 for receiving an operating voltage such as, for example, $V_{CC}$. Further, terminal 54B is coupled to the power supply conductor via resistor 78 for receiving an operating voltage such as, for example, $V_{CC}$. Alternatively, resistors 76 and 78 could be replaced with current mirrors and a push-pull driver circuit (not shown). The output of the push-pull driver circuit would provide a single-ended signal at terminal 54.

The type of transistor in compound mixer circuit 42 is not a limitation of the present invention. For example, transistors having a control terminal and two current carrying terminals such as, for example, Metal Oxide Semiconductor Field Effect Transistors (MOSFETs), Gallium Arsenide Field Effect Transistors (GaAs FETs), or the like, could be used. Compound mixer circuit 42 includes a plurality of mixer circuits 14A, 14B, . . . , 14X coupled between a transconductance circuit 58 and an output circuit 74. The number of mixer circuits 14A, 14B, . . . , 14X is not a limitation of the present invention.

Referring to FIGS. 3 and 4, the operation of compound mixer circuit 42 will now be described. In operation, mixer circuit 14A receives the input signal $RF_{IN}$ and provides an output signal that is translated to a lower frequency. The frequency of the output signal is set in accordance with the signal generated by counter 28A. The signal at the output of counter 28A is set in accordance with select signal $N_{SELA}$ and may be lower than that of signal $V_{OSC}$. Mixer circuit 14B receives the signal from mixer circuit 14A and provides an output signal that is translated to a lower frequency in accordance with the signal generated by counter 28B. In general, each mixer circuit 14A, 14B, . . . , 14X generates an output signal whose carrier frequency differs from that of the input signal received from the previous mixer circuit by the frequency of the signal generated by the corresponding counter 28A, 28B, . . . , 28X.

Figure 5:
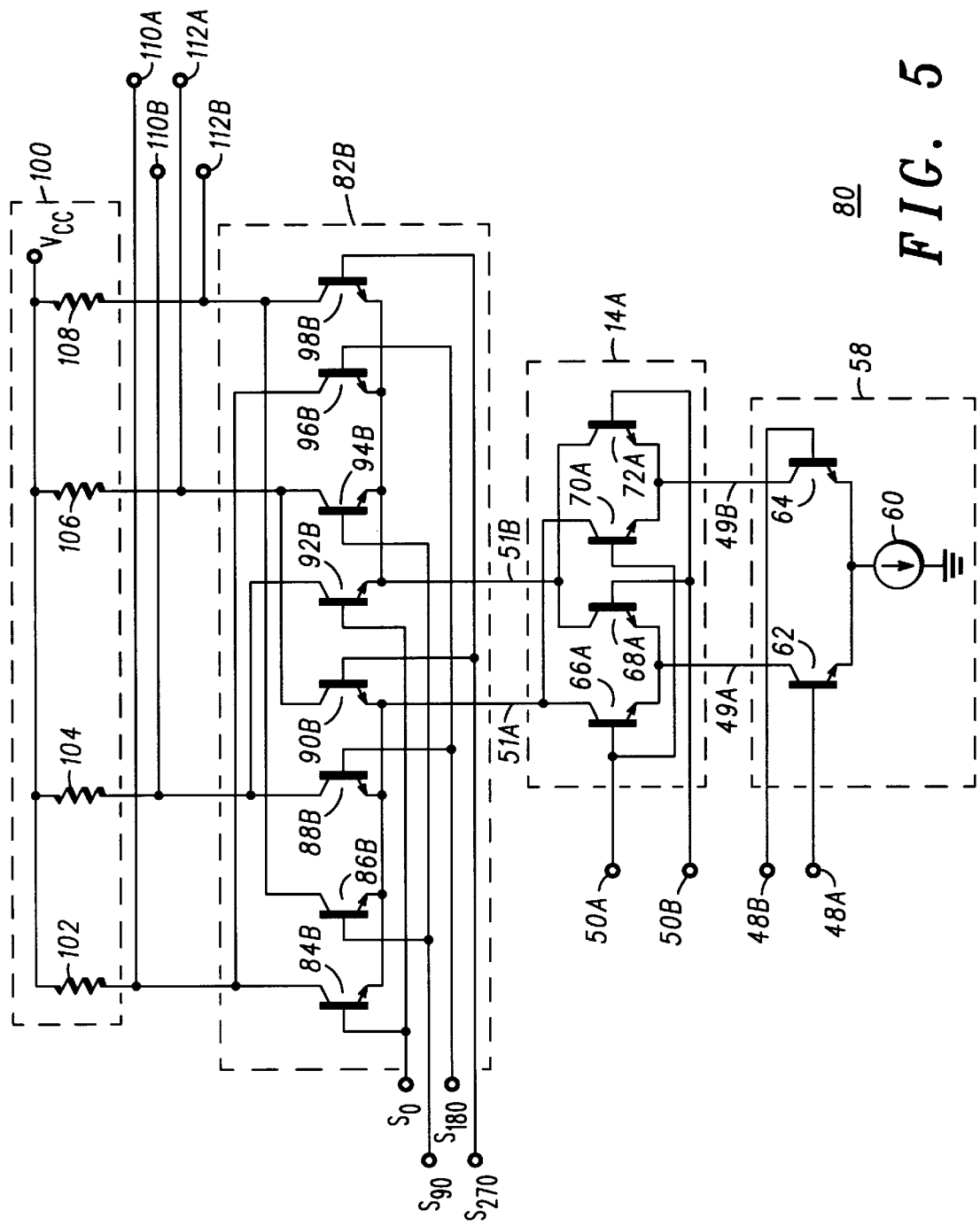
FIG. 5 is a schematic diagram of a quadrature compound mixer circuit in accordance with the present invention.

FIG. 5 is a schematic diagram of a quadrature compound mixer circuit 80 in accordance with another embodiment of the present invention. Quadrature compound mixer circuit 80 can be described with reference to FIGS. 3 and 5, where compound mixer circuit 42 is configured to receive differential signals. In other words, quadrature compound mixer circuit 80 is comprised of a transconductance circuit 58 that receives the differential input signal $RF_{IN}$ at terminals 48A and 48B and provides differential signals at terminals 49A and 49B. Mixer circuit 14A receives the differential signals at terminals 49A and 49B and differential signals generated by counter 28A at terminals 50A and 50B and provides differential signals at terminals 51A and 51B.

Quadrature compound mixer circuit 80 includes a second mixer circuit 82B that is coupled to mixer circuit 14A. Briefly referring to FIG. 3, an embodiment having two mixer circuits includes mixer circuits 14A and 14X. Mixer circuit 14X has differential inputs at terminal 56 (FIG. 3) and can be replaced by mixer circuit 82B, which has differential quadrature inputs (FIG. 5). In this embodiment, counter 28X and phase shifter 30X (FIG. 3) generate quadrature signals $S_0$, $S_{90}$, $S_{180}$, and $S_{270}$ for mixer circuit 82B. It should be noted that signals $S_0$ and $S_{180}$ are 180° out-of-phase with respect to each other. Similarly, signals $S_{90}$ and $S_{270}$ are 180° out-of-phase with respect to each other. Further, signals $S_0$ and $S_{90}$ have a quadrature relationship, i.e., signals $S_0$ and $S_{90}$ are 90° out-of-phase with respect to each other.

Mixer circuit 82B includes four differential pairs of NPN bipolar transistors. More particularly, mixer circuit 82B includes differential transistor pairs 84B and 88B, differential transistor pairs 86B and 90B, differential transistor pairs 92B and 96B, and differential transistor pairs 94B and 98B. Transistors 84B, 86B, 88B, and 90B have emitters that are commonly connected to each other and serve as terminal 51A. Transistors 92B, 94B, 96B, and 98B have emitters that are commonly connected to each other and serve as terminal 51B. The letters A and B have been appended to reference number 51 to indicate that terminals 51A and 51B receive differential signals.

Transistors 84B and 92B have bases that are commonly connected to each other and receive the signal $S_0$. Transistors 86B and 94B have bases that are commonly connected to each other and receive the signal $S_{90}$. Transistors 88B and 96B have bases that are commonly connected to each other and receive the signal $S_{180}$. Transistors 90B and 98B have bases that are commonly connected to each other and receive the signal $S_{270}$. Further, transistors 84B and 96B have collectors that are commonly connected to each other and serve as terminal 110A. Transistors 88B and 92B have collectors that are commonly connected to each other and serve as terminal 110B. Transistors 90B and 94B have collectors that are commonly connected to each other and serve as terminal 112A. Transistors 86B and 98B have collectors that are commonly connected to each other and serve as terminal 112B. The letters and A and B have been appended to reference numbers 110 and 112 to indicate that terminals 112A and 112B supply differential quadrature signals.

Quadrature compound mixer circuit 80 further includes an output circuit 100 having inputs connected to terminals 110A, 110B, 112A and 112B of mixer circuit 82B. Terminals 110A, 110B, 112A and 112B are coupled via respective resistors 102, 104, 106 and 108 in output circuit 100 to a power supply conductor such as, for example, $V_{CC}$. It should be noted that output circuit 74 (FIG. 3) provides differential outputs, whereas output circuit 100 (FIG. 5) provides differential quadrature outputs. In other words, the differential signal supplied at terminals 110A and 110B has a quadrature relationship with the differential signal supplied at terminals 112A and 112B.

Referring now to FIGS. 3 and 5, the operation of quadrature compound mixer circuit 80 is described. A frequency translation of the signal $RF_{IN}$ to a lower frequency occurs in mixer circuit 14A. The lower frequency is determined by the frequency of the signal generated by counter 28A. In addition, a second frequency translation of the signal received from mixer circuit 14A occurs in mixer circuit 82B. The lower frequency is determined by the frequency of the signal generated by counter 28X. Counter 28X and phase shifter 30X generate the quadrature signals $S_0$, $S_{90}$, $S_{180}$ and $S_{270}$ for mixer circuit 82B. Mixer circuit 14A translates the frequency of the signal $RF_{IN}$ to a lower frequency in accordance with select signal $N_{SELA}$ for counter 28A. Mixer circuit 82B translates the frequency of the signal received from mixer circuit 14A to a lower frequency in accordance with select signal $N_{SELX}$ for counter 28X. The differential signal at terminals 112A and 112B has the same frequency as the signal at terminals 110A and 110B, but has a quadrature phase relationship.

By now it should be appreciated that a structure and a method have been provided for translating a signal in the RF frequency range to a lower frequency. The use of counters to generate a frequency that is substantially different from the frequency of the reference signal $RF_{IN}$ prevents the "pulling" or "pushing" of the LO signal away from a nominal frequency.

What is claimed is:

1. A frequency translation circuit, comprising:
a first mixer circuit having a first input coupled for receiving a first signal and a second input coupled for receiving a second signal;
a second mixer circuit having a first input coupled to an output of the first mixer circuit and a second input; and
a counter having a first terminal coupled to the second input of the first mixer circuit and a second terminal coupled to the second input of the second mixer circuit to provide signals at the second inputs of the first and second mixer circuits having frequencies different from one another.

2. The frequency translation circuit of claim 1, further comprising a phase shifter having an input coupled to an output of the counter and an output coupled to the second input of the first mixer circuit.

3. The frequency translation circuit of claim 1, further comprising a phase shifter having an input coupled to an output of the counter and an output coupled to the second input of the second mixer circuit.

4. A compound mixer circuit for translating a frequency, comprising:
a first mixer circuit having first and second input terminals and an output terminal;
a first counter having an input coupled for receiving an input signal;
a first phase shift circuit having an input coupled to an output of the first counter and an output terminal coupled to the second input terminal of the first mixer circuit;
a second mixer circuit having a first input terminal coupled to the output terminal of the first mixer circuit;
a second counter having an input coupled for receiving the input signal; and
a second phase shift circuit having an input coupled to an output of the second counter and an output terminal coupled to a second input terminal of the second mixer circuit.

* * * * *